United States Patent [19]

Hogge, Jr. et al.

[11] Patent Number: 4,724,401
[45] Date of Patent: Feb. 9, 1988

[54] ADAPTIVE OSCILLATOR APPARATUS FOR USE IN A PHASE-LOCK LOOP

[75] Inventors: Charles R. Hogge, Jr., Richardson; Karl A. Ireland, Plano, both of Tex.

[73] Assignee: Rockwell International Corporation, El Segundo, Calif.

[21] Appl. No.: 41,897

[22] Filed: Apr. 23, 1987

[51] Int. Cl.[4] .......................... H03B 5/20; H03L 7/12
[52] U.S. Cl. .......................................... 331/4; 331/25; 331/141; 331/179; 331/DIG. 2
[58] Field of Search .......... 331/4, DIG. 2, 25, 177 V, 331/177 R, 179, 141

[56] References Cited

U.S. PATENT DOCUMENTS

| | | | |
|---|---|---|---|
| 4,009,448 | 2/1977 | Hopwood et al. | 331/4 |
| 4,077,015 | 2/1978 | Carson et al. | 331/4 |
| 4,206,420 | 6/1980 | Querry et al. | 331/4 |
| 4,523,157 | 6/1985 | Sato | 331/4 |

*Primary Examiner*—Siegfried H. Grimm
*Attorney, Agent, or Firm*—Bruce C. Lutz; V. L. Sewell; H. Fredrick Hamann

[57] ABSTRACT

A phase-lock loop system incorporates a normally "transparent" oscillator used in detecting whether or not the system is in a locked condition. It is essential that the oscillator, a portion of which is serially involved in the phase-lock loop, have a long time constant, so as to minimally affect the closed loop's transfer function during phase-locked conditions. It is desirable, however, that when the phase-lock loop loses lock that the time constants of the transparent oscillator change to much smaller values for quick response of the oscillator and operation at a high frequency for detection purposes and quick extinction when phase-lock is acquired. The detection of oscillation of the transparent oscillator initiates the application of a low speed sweep signal being applied to the voltage controlled oscillator portion of the phase-lock loop to reestablish phase-locked conditions and eventually return of the transparent oscillator to its long time constant values.

6 Claims, 2 Drawing Figures

ADAPTIVE OSCILLATOR APPARATUS FOR USE IN A PHASE-LOCK LOOP

THE INVENTION

The present invention is generally concerned with electronics, and more specifically concerned with phase-lock loops. Even more specifically, it is concerned with an adaptive oscillator used in detecting whether or not the phase-lock loop is in a phase-locked condition. This oscillator has a fast response and operates in a high frequency mode when the phase-lock loop is not in the locked condition. The oscillator, however, is adaptive and has a long time constant for minimal effect on the closed loop transfer function when the loop is in a locked condition.

BACKGROUND

It is desirable to quickly detect when a phase-lock loop is no longer in lock, and initiate a sweep signal applied to the controllable oscillator comprising a part of the phase-lock loop to reestablish locked conditions. A co-pending application Ser. No. 041,892 filed Apr. 23, 1987 in the name of Karl A. Ireland, and assigned to the same assignee as the present invention, shows one approach to providing this detection and sweep. The time constants of the embedded oscillator circuit used for detecting phase lock conditions had time constants wherein the transfer function of the phase-lock loop, while it was in a locked condition, peaked in excess of that allowed in a particular system using the phase-lock loop. The present invention modifies the oscillator of the referenced Ireland application, so that long time constants are seen by the system when the phase-lock loop is in a locked condition, but short time constants are switched into operation when the phase-lock loop falls out of lock, so that the oscillator may quickly proceed to oscillating at full amplitude and at a high enough frequency to make detection thereof and application of a sweep signal to the controllable oscillator occur in a reasonably short time and also to stop oscillating quickly once phase-lock is acquired.

It is, therefore, an object of the present invention to provide an adaptive oscillator circuit for use in a phase-lock loop, which oscillator alters time constants in accordance with the mode of operation of the phase-lock loop.

Other objects and advantages of the present invention will be apparent from a reading of the specification and appended claims in conjunction with the drawings, wherein:

FIG. 1 is a block schematic diagram of one embodiment of the inventive concept; and FIG. 2 is a block schematic diagram of another embodiment of the present inventive concept.

DETAILED DESCRIPTION

Figure 1:
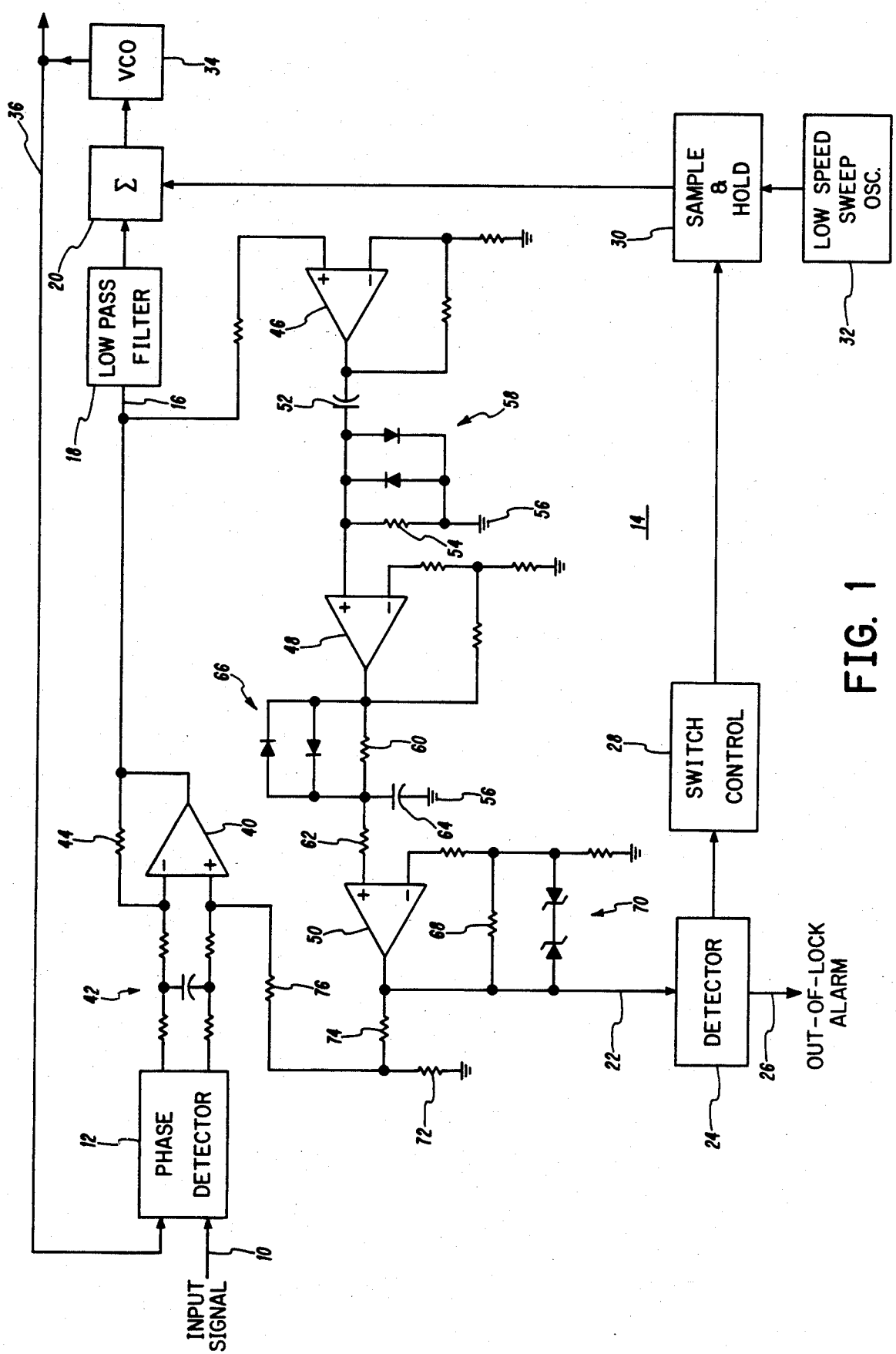

In FIG. 1, an input signal is supplied on a lead 10 to a phase detector 12 which provides outputs to an embedded adaptive oscillator generally designated as 14 which has an output supplied on a lead 16 to a low-pass filter 18 and from there to a summing circuit 20. The oscillator 14 also has an output on a lead 22 to a detection circuit 24 providing an out-of-lock alarm on a lead 26 and a signal to a switch control circuit 28. The switch control circuit 28 provides a switching signal to a sample and hold circuit 30. A low speed sweep oscillator signal is supplied from a block 32 and through the sample and hold 30 to a second input of summing circuit 20. An output of summing circuit 20 is supplied on a lead to a variable or voltage controlled oscillator 34, which provides an apparatus output on a lead 36 and a feedback signal to the phase detector 12.

Within the block generally designated as 14, there is a first amplifier 40, which combines the signals output on two different leads of phase detector 12 via a circuit network, generally designated as 42. Amplifier 40 has a feedback resistor 44. An output of amplifier 40 comprises the previously mentioned lead 16, and the signal is fed back to perform the oscillator function via a set of amplifiers designated as 46, 48 and 50, and their associated resistor and capacitor networks. A capacitor 52 provides a serial connection from the output of amplifier 46 to a non-inverting input of amplifier 48. A resistor 54 is connected from the non-inverting input of amplifier 48 to ground 56. A pair of diodes 58 is connected in parallel with resistor 54. The resistor 54 and capacitor 52 provide a differentiation circuit. A resistor 60, in series with a resistor 62, connects an output of amplifier 48 to a non-inverting input of amplifier 50. A capacitor 64 is connected at a junction between resistors 60 and 62, and is connected at its other end to ground 56. Resistor 60 and capacitor 64 provide an integrator circuit. A pair of diodes 66 are connected in parallel with resistor 60. A feedback resistor 68 is connected from output to inverting input of amplifier 50. A series connected pair of Zener diodes, generally designated as 70, are connected in parallel with resistor 68. A set of resistors 72, 74 and 76 are connected as shown from the output of amplifier 50 to the non-inverting input of amplifier 40 for providing an attenuation network, whereby the oscillatory signal being fed through low-pass filter 18 to summing circuit 20 is minimized while being maximized on lead 22 to detector 24.

Figure 2:
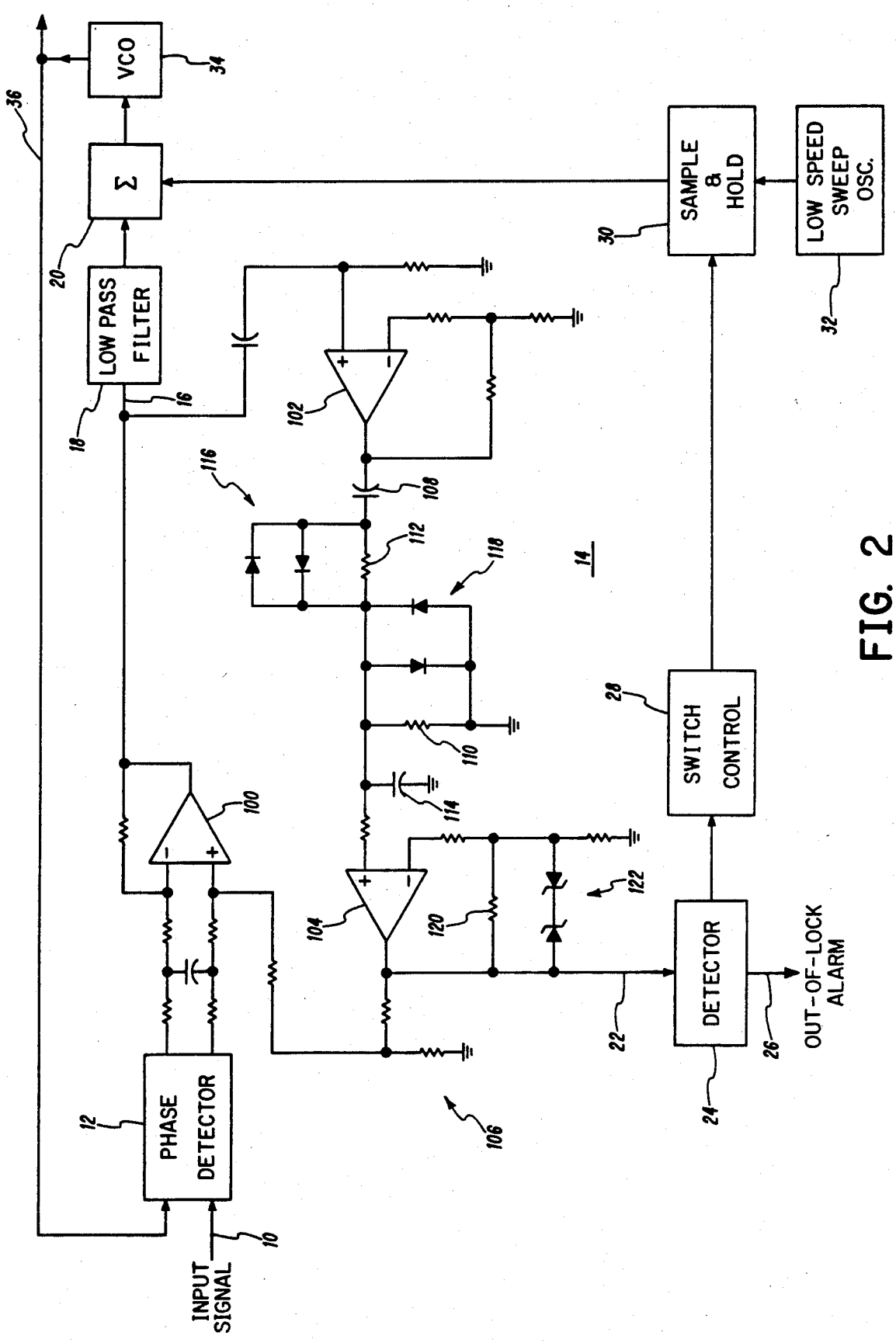

In FIG. 2, the components from 10 through 36 are labeled in an identical fashion to that of FIG. 1, and may comprise the same elements. Within amplifier 14 is shown an amplifier 100, corresponding generally to amplifier 40 of FIG. 1. An amplifier 102 corresponds generally with amplifier 46 of FIG. 1 and an amplifier 104 corresponds generally with amplifier 50 of FIG. 1. A set of resistors, generally designated as 106, correspond generally with resistors 72 through 76 of FIG. 1. Between amplifiers 102 and 104 is both a differentiator or lead circuit comprising a capacitor 108 and a resistor 110 and a lag or integrator circuit comprising a resistor 112 and a capacitor 114. A set of diodes 116 is connected in parallel with resistor 112, and a similar set of diodes generally designated as 118 is connected in parallel with resistor 110. Diodes 116 comprise the same function as diodes 66 in FIG. 1, whereas diodes 118 provide the same function as diodes 58 in FIG. 1. A feedback resistor 120 is connected in parallel with a set of Zener diodes, generally designated as 122, from output to input of amplifier 104. Again, diodes 122 correspond generally to the diodes 70 of FIG. 1. It may be mentioned here, that the diodes 70 and their alternate embodiment 122, were required due to the design of a power supply required in conjunction with the use of this invention, and would not be necessary with all power supplies. Further, the detector 24, while detecting the function of oscillating of oscillator 14, in actuality detects the amplitude of signals occurring at lead 22 relative a reference. Both of these comments may be found in the referenced application for patent.

OPERATION

As discussed in the referenced patent application, a phase-locked loop including the phase detector 12, the oscillator 14, and controlled oscillator 34 reduces the gain of in-line amplifier 40, while the phase lock system is in a locked system. When the system falls out of lock, the gain of amplifier 40 rises and the oscillator commences oscillating. The frequency at which the oscillator oscillates is determined by the differentiator and integrator circuits in the feedback network around the amplifier 40. The differentiator circuit is often called a lead circuit, while an integrator circuit is often called a lag circuit. The oscillator will oscillate at a frequency where the phase of the signal passing through the lead circuit is leading by exactly the same amount as the signal passing through the lag circuit is lagging. The values of these lead and lag circuits determine the poles and zeros associated with the transfer function of the oscillator and may affect the poles and zeros of the entire phase-locked loop depending on their location. As shown in FIG. 1, the differentiator or lead circuit is between amplifiers 46 and 48, while the integrator or lag circuit is between amplifiers 48 and 50. In FIG. 2, the components of the lead and lag circuits are somewhat separated in the visual representation, but all of them are contained between amplifier 102 and amplifier 104, thus eliminating the requirement for one amplifier.

As long as the phase-lock loop is locked, the gain in each of the amplifiers comprising oscillator 14 is of such a value that there is no substantial signal through the resistors comprising a part of the phase lag and phase lead circuit. When the system goes out of lock, various stray signals, as amplified by amplifiers 46 and 102, will cause the diodes, such as 58 and 66, to affect the resistive portion of the impedance as seen by capacitors 52 and 64. Thus, the time constants of these two circuits will change as the diodes go into forward conduction due to the amplitude of signals flowing in the feedback network around the main oscillator amplifier such as 40.

In summary, the oscillator 14 has a first set of time constants wherein the impedance of the diodes, such as 58 and 66, is so high relative their parallel connected resistors, that the resistive elements substantially define the resistive portion of the time constant circuit. When the phase-locked loop loses synchronization, the gain of the amplifier 40 rises and signals passing through the feedback network portion of this amplifier will cause forward conduction of the shunt connected diodes, such as 58 and 66, thereby substantially reducing the resistance in the resistive portion of each of the two time constant circuits.

We thus wish to be limited not by the specific embodiments illustrated, but only by the concept as defined in the appended claims, wherein we claim:

1. Phase lock loop out-of-lock detection apparatus comprising, in combination:
   phase lock loop means, including phase detector means having signal input means and including controllable oscillator means having control signal input means, connected in a serial looped arrangement whereby said controllable oscillator means may lock to and be synchronized with a signal applied to said signal input means of said phase detector means;
   adaptive oscillatory type circuit means, a portion of said oscillatory type circuit means being connected serially between said phase detector means and said controlled oscillator means, said oscillatory type circuit means normally being transparent to phase lock loop operations and operating in an oscillatory mode only when said controllable oscillator means is not synchronized to the signal supplied to said signal input means, said adaptive oscillatory type circuit including internally,
   differentiator circuit means including capacitive and resistive means,
   integrator circuit means including capacitive and resistive means,
   diode means connected in parallel with said resistive means of each of said differentiator and integrator circuit means,
   the adaptive oscillatory type circuit means oscillating at a frequency consistent with the phase shift in the differentiator circuit means being equal and opposite that in the integrator circuit means,
   the impedance of the parallel connected diodes dropping upon a rise of voltage thereacross pursuant to a rise in gain when said phase lock loop becomes out of lock thereby changing the frequency of oscillation of said adaptive oscillatory type circuit means;
   detector means, connected to said adaptive oscillatory type circuit means, for providing an output signal indicating out-of-lock conditions upon detection of oscillations of said oscillatory type circuit means; and
   sweep oscillator means, connected between said detector means and said control signal input means of said controllable oscillator means, for supplying a sweep signal to said controllable oscillator means only while receiving said out-of-lock signal from said detector means.

2. Adaptive oscillator means for use in conjunction with a phase lock loop as part of a lock detection circuit means, said oscillator means comprising, in combination:
   signal amplifying means including input means and output means;
   feedback means, connected from said output means to said input means of said signal amplifying means, said feedback means including phase lag and phase lead circuit means wherein the frequency of oscillation is in accordance with impedance characteristics of said phase lag and lead circuit means; and
   gain sensitive means incorporated in said phase lag and lead circuit means for changing at least some of said impedance characteristics in accordance with the gain of said signal amplifying means and thus changing the inherent operational frequency of said adaptive oscillator means.

3. Adaptive oscillator apparatus comprising, in combination:
   amplifier first means including input means and output means;
   feedback second means connected from said output means of said amplifier means to said input means thereof, said feedback means including RC phase lag and RC phase lead networks which networks act to determine the operational frequency of oscillation of said apparatus; and
   signal amplitude sensing third means, connected to said second means, for shunting a portion of at least one of said RC phase lag and lead networks, upon sensing of a given amplitude signal, the shunting causing the oscillation frequency determining characteristics of said networks to be altered thereby causing said oscillator to oscillate at a different frequency.

4. The method of changing the time constants in a feedback portion of an oscillatory type circuit, and thus the operational oscillatory frequency of the circuit, embedded in a phase lock loop circuit where the gain of said oscillatory type circuit decreases when phase lock occurs in the phase lock loop comprising the steps of:
monitoring the gain of the oscillatory type circuit; and
shunting at least one component of the feedback portion of the oscillatory type circuit, to thereby change the time constants of said portion, when the gain of said oscillatory type circuit exceeds a given amount.

5. Oscillator circuit means comprising, in combination:
amplifier means, including input means and output means;
feedback means, including time constant means comprising a plurality of components;
means connecting said feedback means between said input means and said output means of said amplifier means;
further circuit means connected to at least some of the components of said feedback means; and
signal amplitude detection means, connected to said feedback means and to said further means, for modifying the impedance of said at least some of the components of said feedback means when the signal detected exceeds a given amplitude.

6. Oscillator circuit means comprising, in combination:
amplifier means, including input means and output means;
feedback means, including time constant means comprising a plurality of components;
means connecting said feedback means between said input means and said output means of said amplifier means;
further circuit means connected to at least some of the components of said feedback means; and
gain detection means, connected to said amplifier means and to said further means, for modifying the impedance of said at least some of the components of said feedback means, and thus the time constant, when the gain detected exceeds a given value.

* * * * *